United States Patent [19]

Nakamura

[11] Patent Number: 4,885,227

[45] Date of Patent: Dec. 5, 1989

[54] IMAGE-RECEIVING MATERIAL AND IMAGE-FORMING METHOD EMPLOYING THE SAME

[75] Inventor: Taku Nakamura, Kanagawa, Japan

[73] Assignee: Fuji Photo Film Co., Ltd., Kanagawa, Japan

[21] Appl. No.: 165,060

[22] Filed: Mar. 7, 1988

[30] Foreign Application Priority Data

Mar. 6, 1987 [JP] Japan .................................. 62-51619

[51] Int. Cl.[4] .......................... G03C 5/54; G03C 1/68; G03F 7/26
[52] U.S. Cl. .................................... 430/254; 430/138; 430/255
[58] Field of Search ............... 430/138, 253, 254, 255, 430/213, 232, 211, 231, 202, 199

[56] References Cited

U.S. PATENT DOCUMENTS

| | | | |
|---|---|---|---|
| 3,305,360 | 2/1967 | Leone et al. | 430/255 |
| 3,586,502 | 6/1971 | Farney | 430/232 |
| 4,352,873 | 10/1982 | Toda et al. | 430/556 |
| 4,483,912 | 11/1984 | Sanders | 430/138 |
| 4,687,725 | 8/1987 | Wright et al. | 430/253 |
| 4,764,451 | 8/1988 | Ishikawa et al. | 430/253 |

FOREIGN PATENT DOCUMENTS

| | | |
|---|---|---|
| 2228085 | 7/1987 | European Pat. Off. . |
| 941962 | 11/1963 | United Kingdom . |
| 999891 | 7/1965 | United Kingdom . |
| 1060806 | 3/1967 | United Kingdom . |
| 1084513 | 7/1967 | United Kingdom . |
| 1280001 | 7/1972 | United Kingdom . |
| 2026709 | 2/1980 | United Kingdom . |

Primary Examiner—Richard L. Schilling
Attorney, Agent, or Firm—Sughrue, Mion, Zinn, Macpeak & Seas

[57] ABSTRACT

An image-receiving material comprises a support and an image-receiving layer characterized in that the image-receiving layer contains a hardening agent being capable of polymerizing a polymerizable compound without necessity of external energy. An image-forming method employing the image-receiving material is also disclosed. The image-forming method comprises: imagewise exposing to light a light-sensitive material comprising a support and a light-sensitive layer containing silver halide, a reducing agent and a polymerizable compound; simultaneously or thereafter developing the light-sensitive material; and pressing the light-sensitive material on the image-receiving material to transfer the unpolymerized polymerizable compound to the image-receiving layer.

13 Claims, No Drawings

IMAGE-RECEIVING MATERIAL AND IMAGE-FORMING METHOD EMPLOYING THE SAME

FIELD OF THE INVENTION

This invention relates to an image-receiving material comprising a support and an image-receiving layer, and to an image-forming method employing the image-receiving material.

BACKGROUND OF THE INVENTION

An image-receiving material is employable in an image-forming method which comprises imagewise polymerizing a polymerizable compound contained in a recording material; and transferring the unpolymerized polymerizable compound from the recording material to the image-receiving material.

Examples of the image-forming method are described in Japanese Patent Provisional Publications Nos. 57(1982)-179836, 58(1983)-88739, 58(1983)-88740 (corresponding to U.S. Pat. No. 4,440,846), 59(1984)-30537, 59(1984)-137944 (corresponding to U.S. Pat. No. 4,483,912) and 60(1985)-259490 (corresponding to U.S. Pat. No. 4,554,235). The image-forming method comprises: imagewise exposing to light the light-sensitive material containing a photopolymerization initiator and a polymerizable compound to imagewise polymerize the polymerizable compound; and pressing the light-sensitive material on an image-receiving material to transfer the unpolymerized polymerizable compound to the image-receiving material.

Recently, it has been found that the image-receiving materials can be advantageously used for another image-forming method employing silver halide as photosensor. The image-forming method is described in Japanese Patent Provisional Publications Nos. 61(1986)-69062 and 61(1986)-73145 (the contents of both publications are described in U.S. Pat. No. 4,629,676 and European Patent Provisional Publication No. 0174634A2). The image-forming method comprises: imagewise exposing to light a light-sensitive material comprising a support and a light-sensitive layer containing silver halide, a reducing agent and a polymerizable compound; simultaneously or thereafter developing the light-sensitive material; and pressing the light-sensitive material on the image-receiving material to transfer the unpolymerized polymerizable compound to the image-receiving layer.

Japanese Patent Provisional Publication No. 62(1987)-161149 describes an embodiment of the image-forming method in which an image-receiving material containing a photopolymerization initiator in the image-receiving layer is employed and the image-receiving material to which unpolymerized polymerizable compound has been tranferred is irradiated with light. In this method, the unpolymerized polymerizable compound transferred to the image-receiving material is hardened by the photo polymerization initiator and the iradiation of light. Thus, this method is very effective in improving the preservation stability of the image.

SUMMARY OF THE INVENTION

An object of the present invention is to provide an image-receiving material which allows an image transferred thereon to be easily fixed.

Another object of the invention is to provide an image-forming method employing the above image-receiving material.

There is provided by the present invention an image-receiving material comprising a support and an image-receiving layer containing a hardening agent being capable of polymerizing a polymerizable compound with no necessity of external energy.

There is further provided by the present invention an image-forming method which comprises:

imagewise exposing to light a light-sensitive material comprising a support and a light-sensitive layer containing silver halide, a reducing agent and a polymerizable compound;

simultaneously or thereafter developing the light-sensitive material;

pressing the light-sensitive material on an image-receiving material comprising a support and an image-receiving layer to transfer the unpolymerized polymerizable compound to the image-receiving layer of the image-receiving material, wherein the image-receiving layer contains a hardening agent being capable of polymerizing the polymerizable compound necessity of external energy.

The image-receiving layer of the image-receiving material of the present invention contains a hardening agent (curing agent) which makes it possible that the transferred image can be hardened in the absence of any external energy such as light or heat. Thus, the transferred image can be simply fixed on the image-receiving layer without any additional treatment. In more detail, the image-receiving layer contains a compound (a hardening agent) which allows the unpolymerized polymerizable compound transferred to the image-receiving material to be easily polymerized and hardened. Therefore, the image can be fixed without any extra fixing treatment (light irradiation or heating) after the transfer process. It is believed that the polymerization reaction (hardening reaction) of the present invention predominantly is Michael reaction between the hardening agent and the polymerizable compound.

The image-receiving material of the present invention is particularly suitable for use in the image-forming method employing a light-sensitive material comprising a support and a light-sensitive layer containing silver halide, a reducing agent and a polymerizable compound.

The hardening agent of the present invention is a relatively stable compound against light or heat, as compared with a photopolymerization initiator or a thermal polymerization initiator. Accordingly, the image-receiving material of the invention is improved in the preservability compared with the image-receiving material described in Japanese Patent Provisional Publication No. 62(1987)-161149.

DETAILED DESCRIPTION OF THE INVENTION

The present invention characterized in a hardening agent which can polymerize the polymerizable compound without requiring any external energy. There is no specific limitation with respect to the hardening agent, except that the hardening agent can be reacted with a polymerizable compound (including a compound which can be reacted in the presence of a catalyst). Accordingly, the hardening agent of the present invention can be selected from various compounds which are reactive with a polymerizable compound contained in a recording material.

The polymerizable compound varies depending on the embodiment of the recording material (e.g., light-sensitive material containing a photopolymerization initiator as photosensor or light-sensitive material containing silver halide as photosensor). In these recording materials (light-sensitive materials), a compound having an ethylenic unsaturated bond has been preferably used as the polymerizable compound. Therefore, the hardening agent is preferably capable of polymerizing a polymerizable compound having an ethylenic unsaturated bond without external energy. Further, in the case that the polymerizable compound has two or more ethylenic unsaturated bonds in the molecule, the hardening agent of the present invention preferably has two or more nucleophilic groups in the molecule so that the hardening agent and the polymerizable compound can form a copolymer. It is also desirable that the hardening agent is a compound which is highly nucleophilic and is less sterically hindered. Preferred examples of the nucleophilic groups include imino group, amino group and sulfino group (sulfinic acid group).

Examples of the compound having the nucleophilic groups include ethylenediamine, propylenediamine, 1,3-diamino-2-hydroxypropane, 1,3-trimethylenediamine, N,N'-dimethylethylenediamine, 1,4-diaminobutane, hexamethylenediamine, diethylenetriamine, triethylenetetraamine, the compound having the formula:

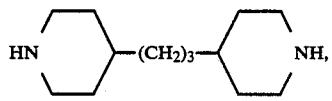

the compound having the formula:

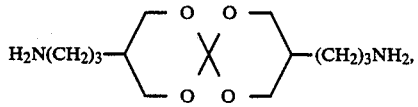

polyethyleneimine, polyallylamine, poly-L-lysine, poly-L-ornithine, the compound having the formula:

and sodium salt of polyvinylbenzenesulfinic acid. These compound may be used singly or in combination. Among them, polyethyleneimine, 1,3-diamino-2-hydroxypropane and sodium salt of polyvinylbenzenesulfinic acid are particularly preferred. It is thought that the reaction between the hardening agent and the polymerizable compound proceeds by Michael reaction. Therefore, the reaction preferably proceeds under basic conditions.

The image-receiving layer can be constructed according to the color formation system. In the cases that a polymer image is formed on the image-receiving material and that a dye or pigment is employed as the color image forming substance, the image-receiving material can be simply composed of a support and the hardening agent of the invention which is coated on the support as the image-receiving layer.

The image-receiving layer can be constituted in optional form depending on the image-forming method. The image-receiving layer can further contain the other optional components than the hardening agent. Examples of the optional components of the image-receiving layer include a binder, a developer, a mordant, a thermoplastic compound, a white pigment, a photo polymerization initiator and a thermal polymerization initiator.

Binders employable in the image-receiving layer preferably are transparent or semi-transparent hydrophilic binders. Examples of binders include natural substances, such as gelatin (e.g., limed gelatin, oxidized gelatin, enzymed gelatin), gelatin derivatives, denatured gelatin, proteins (e.g., colloidal albumin, casein), cellulose derivatives (e.g., carboxymethyl cellulose, hydroxyethyl cellulose), saccharose derivatives (e.g., agar, starch, sodium of alginic acid), gum arabic; and synthetized polymeric substances, such as polyvinyl alcohol, polyvinylpyrrolidone, polyacrylic acid copolymer, hydrophilic polyvinyl compound (e.g., polyacrylamide monomer), or their derivatives and partial hydrolysis. In addition to the synthetic polymeric substances, vinyl compounds dispersed in the form of latex. These binders can be used singly or in combination.

Further, a polymer having a transmission coefficient of oxygen of not more than $1.0 \times 10^{-11}$ $cm^3 \cdot cm/cm^2 \cdot sec \cdot cmHg$ can be used as the binder to protect the color of the image formed on the image-receiving material.

The binder is preferably used in the image-receiving layer in an amount of from 0.01 to 100 $g/m^2$, and more preferably from 0.1 to 10 $g/m^2$.

In the case that a color formation system using two or more components which develop to give a color in contact with other components (e.g., a color former and a color developer) is employed, one or more components can be contained in a recording material as a color image forming substances, and the other component can be contained in the image-receiving layer as the color developer. The color formation system using an image-receiving material is preferably employed to form a clear color image.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29-58 (pressure-sensitive copying paper), pp. 87-95 (azo-graphy), pp. 118-120 (heat-sensitive color formation by a chemical change ) or in MSS. of the seminer promoted by the Society of Kinki Chemical Industry, "The Newest Chemistry of Coloring Matter-Attractive Application and New Development as a Functional Coloring Matter", pp. 26-32 (June 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc. Among them, a reaction between a leuco dye and an acid color developer is preferably employed.

When the above described color formation system is employed, a developer (or a component corresponding to the developer) is preferably contained in the image-receiving layer.

In the case that dyes or pigments are used as a color image forming substance, a mordant can be contained in the image-receiving layer. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer can contain a granulated thermoplastic compound. In the case that the granulated thermoplastic compound is contained in the image-receiving layer, the image-receiving layer itself is preferably constituted in the form of cohesion of granulated themoplastic compound. The image-receiving layer containing the granulated thermoplastic compound can easily form a transferred image easily, and can give a glossy image by heating it after image formation. There is no specific limitation with respect to the granulated thermoplastic compound, and can be used by selecting optionally from the knwon plastic resin, wax and the like. The glass transition point of the granulated thermoplastic compound and the melting point of wax are preferably not higher than 200° C.

Dyes or pigments may be contained in the image-receiving layer for the purpose of entering letters, symbols, frames or the like in the image-receiving layer, or of giving a certain color to the background of the image. Further, dyes or pigments may be also employed for the purpose of making it easy to distinguish the sides of the image-receiving material. There is no specific limitation on dyes or pigments, and those which may be used as the color image forming substance are also employable as these dyes or pigments. But in the case that these dyes or pigments may disturb the image formed on the image-receiving layer, it is preferred to make density of dyes or pigments low (e.g., reflection density of not higher than 1), or to employ dyes or pigments showing a discoloring character in time of heating or light irradiation.

Further, when the white pigments, such as titanium dioxide, barium sulfate etc. are contained in the image-receiving layer, the image-receiving layer may function as a white reflection layer. In this case, the white pigments are used in an amount of from 10 g to to 100 g based on 1 g of the thermoplastic material.

The above-metnioned dyes or pigments may be either uniformly or locally contained in the image-receiving layer. For example, when the support is composed of transparent material, the white pigments may be partially contained in the image-receiving layer to make a part of the reflection image to be transparent. Thus, information of the image which is unnecessary in the transparent image may be entered in the part of the image-receiving layer containing the white pigments as the reflection image.

The image-receiving material can be prepared by providing the image-receiving layer on the support. The image-receivign material is usually prepared by dissolving, emulsifying or dispersing each of the components of the image-receivign layer including the hardening agent in an adequate medium to obtain coating solution, and then coating and drying the obtained coating solution on a support. The coating solution can be prepared by mixing liquid compositions each containing a component of the image-receiving layer.

Two or more coating solutions containing optional components can be used to form two or more layers by coating the solutions on a support in order to give a desired function.

The hardening agent is preferably contained in the image-receiving layer in an amount of 0.0001 to 0.1 mole/$m^2$, and more preferably in an amount of 0.001 to 0.05 mole/$m^2$. Further, the hardening agent is prefrably used in an amount of 0.1 to 200 mole % based on the amount of the polymerizable compound contained in the light-sensitive layer, and more preferably in an amount of 1 to 50 mole %.

The thickness of the image-receiving layer preferably ranges from 1 to 100 $\mu$m, more preferably from 1 to 20 $\mu$m.

A protective layer can be provided on the surface of the image-receiving layer. A layer consisting of granulated thermoplastic compound can be provided on the image-receiving layer. The thermoplastic compound which may be employed in the image-receiving layer is also employable for the layer consisting of the granulated thermoplastic compounds.

Examples of the material employable for the preparation of the support of the image-receiving material include glass, paper, fine paper, coat paper, cast coated paper, baryta paper, synthetic paper, metales and analogous thereof, polyester, acetyl cellulose, cellulose ester, polyvinyl acetal, polystyrene, polycarbonate, polyethylene terephthalate, and paper laminated with resin or polymer (e.g., polyethylene).

In the case that a porous material, such as paper is employed as the support of the image-receiving material, the porous support support preferably has such a surface characteristic that a filtered maximum waviness of not less than 4 $\mu$m is observed in not more than 20 positions among 100 positions which are determined at randam on a filtered waviness curve obtained according to JIS-B-0610. In order to obtain a transparent image, the support should be made of a transparent material. In this case, the transmittance of the support preferably is not less than 30%, more preferably is not less than 50%.

The image-forming method employing the image-receiving material of the invention is described below.

In the use of the image-receiving material of the invention, an image of the recording material is transferred to the image-receiving layer.

Examples of the image-forming method which advantageously employs the image-receiving material of invention include a method using a photopolymerization initiator as photosensor described in Japanese Patent Provisional Publication Nos. 57(1982)-179836, 58(1983)-88739, 58(1983)-88740 and 59(1984)-30537; and a method employing employs a silver halide as photosensor described in Japanese Patent Provisional Publication Nos. 61(1986)-69062 and 61(1986)-73145. The latter method is preferred from the viewpoint of the sensitivity.

As mentioned above, the image-receiving material is preferably used in an image-forming method which comprises:

imagewise exposing to light a light-sensitive material comprising a support and a light-sensitive layer containing silver halide, a reducing agent and a polymerizable compound;

simultaneously or thereafter developing the light-sensitive material;

pressing the light-sensitive material on an image-receiving material comprising a support and an image-receiving layer to transfer the unpolymerized polymerizable compound to the image-receiving layer of the image-receiving material.

The image-forming method employing the light-sensitive material is described below.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149 (corresponding to U.S. Pat. No. 3,697,275). The image forming method described in Japanese Patent Provisional Publication No. 61(1986)-69062 (corresponding to U.S. Pat. No. 4,629,676 and European Patent Provisional Publication No. 0174634A2) which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. The heating temperature for the development process usually ranges from 80° C. to 200° C., and preferably from 100° C. to 160° C. Various heating patterns are applicable. The heating time is usually not shorter than 1 second, and preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

As a result, the polymerizable compound within the area where the latent image of the silver halide has been formed (or the area where the latent image of the silver halide has not been fomed) is polymerized.

After the development process, the light-sensitive material is pressed on the image-receiving material to transfer the unpolymerized polymerizable compound to the image-receiving material. The process for pressing can be carried out in various known manners.

When the unpolymerized polymerizable compound is transferred to the image-receiving material, the unpolymerized polymerizable compound is polymerized by the function of the hardening agent. A fixed polymer image is thus formed on the image-receiving layer.

In the case that the light-sensitive layer contains a color image forming substance, the color image forming substance is fixed by polymerization of the polymerizable compound. Then, pressing the light-sensitive material on the image-receiving material to transfer the color image forming substance with the unpolymerized polymerizable compound in unfixed portion, a color image can be produced on the image-receiving material.

The image-receiving material of the invention can be used for various image fomation systems, such as monochromatic or color photography, printing, radiography, diagnosis (e.g., CRT photography of diagnostic device using supersonic wave), copy (e.g., computer-graphic hard copy), etc.

The light-sensitive material which can be advantageously used for the image-forming method of the invention is described below. The light-sensitive material used in the invention comprises a support and a light-sensitive layer containing silver halide, a reducing agent and a polymerizable compound. Thus composed material is referred hereinafter to as "light-sensitive material".

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. A silver halide grain can have a core/shell structure in which the silver iodide content in the shell is higher than that in the core. There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination. There is also no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in the these publications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ringopening reaction include the compounds having an epoxy group. Among them, the compounds having an ethylenic unsaturated group are preferred.

In the present invention, a compound having two or more ethylenic unsaturated groups in the molecule is more preferably used as the polymerizable compound. Further, an acrylic ester or an acrylic amide (including not only acrylamide, but also amides composed of acrylic acid and various amines) is preferably used as the polymerizable compound in the present invention.

The polymerizable compounds can be used singly or in combination of two or more compounds. For example, a mixture of two or more polymerizable componds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include same materials for the preparation of the support of the image-receiving material.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50% by weight.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm.

In the case that silver halide grains are contained in the microcapsule, the silver halide grains are preferably arranged in the shell material of the microcapsules.

The light-sensitive layer can further contain optional components such as color image forming substance, sensitizing dyes, organic silver salts, various kinds of image formation accelerators, thermal polymerization inhibitors, thermal polymerization initiators, development stopping agents, fluorescent brightening agents, discloloration inhibitors, antihalation dyes or pigments, antiirradiation dyes or pigments, matting agents, antismudging agents, plasticizers, water releasers, binders, photo polymerization initiator and solvent of the polymerizable compound.

The details of the color image forming substance has been mentioned as a component of the image-reveiving layer. The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an αhydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of the image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. In the case that the light-sensitive material is heat-developed, a compound which releases a base when it is heated (generally, 80 to 200° C.) is preferably used.

Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate and 4-acetylaminomethyl propiolate.

These bases or base precursors are preferably used in an amount of not more than 50% by weight, and more preferably from 0.01 to 40% by weight, based on the total solid content of the light-sensitive layer. These bases or base precursors can be used singly or in combination.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development.

The antismudging agents employable in the light-sensitive material preferably are particles which are solid at ambient temperatures. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. The binder which may be employed in the above-mentioned image-receiving layer is also employable for the light-sensitive layer. The light-sensitive material employing a binder is described in Japanese Patent Provisional Publication No. 61(1986)-69062 (corresponding to U.S. Pat. No. 4,629,676 and European Patent Provisional Publication No. 0174634A2).

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9-15 (June 1978).

Examples of auxiliary layers which are optionally arranged on the light-sensitive material include a heating layer, an antistatic layer, an anticurl layer, a release layer, a cover sheet or a protective layer, a layer containing a base or base precursor and a base barrier layer.

The light-sensitive material can be prepared, for instance, by the following process.

The light-sensitive material is usually prepared by dissolving, emulsifying or dispersing each of the components of the light-sensitive layer in an adequate medium to obtain a coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The light-sensitive material of the invention can be prepared by coating and drying the coating solution on a support in the conventional manner.

The present invention is further described by the following examples without limiting the invention.

EXAMPLE 1

Preparation of image-receiving material

To 125 g of water was added 11 g of 40% aqueous solution of sodium hexametaphosphate, and were further added 34 g of 3,5-di-α-methylbenzylsalicylate and 82 g of 55% aqueous slurry of calcium carbonate, followed by coarsely dispersing in a mixer. The coarse dispersion was then finely dispersed in Dynomill dispersing device. To 200 g of the resulting dispersion were added 6 g of 8% latex of SBR (styrene-butadiene rubber) and 55 g of 8% aqueous solution of polyvinyl alcohol, and the resulting mixture was made uniform.

To 8.88 g of the uniform mixture were added 0.81 g of 30% aqueous solution of polyethyleneimine (hardening agent) and 0.81 g of water, and the resulting mixture was coated on a baryta paper using wire bar of #24 and dried at 40° C. for 1 hour to obtain an image-receiving material (A).

EXAMPLES 2 & 3

Image-receiving materials (B) & (C) were prepared in the same manner as in Example 1, except that each of the compounds shown in Table 1 was used in place of polyethyleneimine and the amount of water was changed according to Table 1.

COMPARISON EXAMPLE 1

An image-receiving material (D) was prepared in the same manner as in Example 1, except that polyethyleneimine was not used.

TABLE 1

| Image-Receiving Material | Hardening Agent Compound | Amount (g) | Water Amount (g) |
|---|---|---|---|
| (A) | 30% Aqueous solution of polyethyleneimine | 0.81 | 0.81 |
| (B) | 20% Aqueous solution of polyvinylbenzene sodium sulfinate | 1.55 | 0.07 |
| (C) | 20% Aqueous solution of 1,3-diamino-2-hydroxypropane | 1.02 | 0.60 |
| (D) | — | — | 1.62 |

Preparation of silver halide emulsion

In 1,200 ml of water were dissolved 25 g of gelatin and 1.5 g of sodium chloride, and the resulting gelatin solution was kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 15 minutes. After 5 minutes, to the solution was further added 200 ml of aqueous solution containing 4.3 g of potassium iodide at the same feed rate over a period of 5 minutes to obtain a silver bromoiodide emulsion.

After the emulsion was washed for desalting, to the emulsion was added 24 g of gelatin and stirred for 30 minutes to obtain a silver halide emulsion. Yield of the emulsion was 1,000 g.

Preparation of light-sensitive composition

In 100 g of trimethylolpropane triacrylate (tradename M-309, produced by Toagosei Chemical Industry Co., Ltd.) were dissolved 0.40 g of the following copolymer, 10.00 g of Pargascript Red I-6-B (tradename of Chiba-Geigy).

(Copolymer)

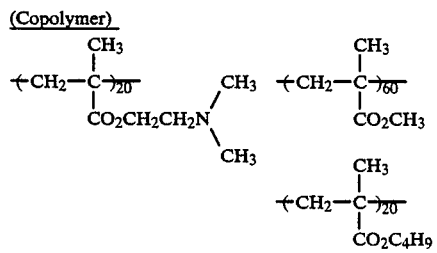

To 18.00 g of the solution were added 1.29 g of the following hydradine derivative (reducing agent (I)), 1.22 g of developing agent (reducing agent (II)), 0.20 g of 1% ethyl acetate solution of the following compound (antifogging agent) and 0.36 g of Emulex NP-8 (tradename of Nippon Emulsion Co., Ltd.). To the mixture was further added 4.0 g of methylene chloride, and the resulting mixture was made uniform.

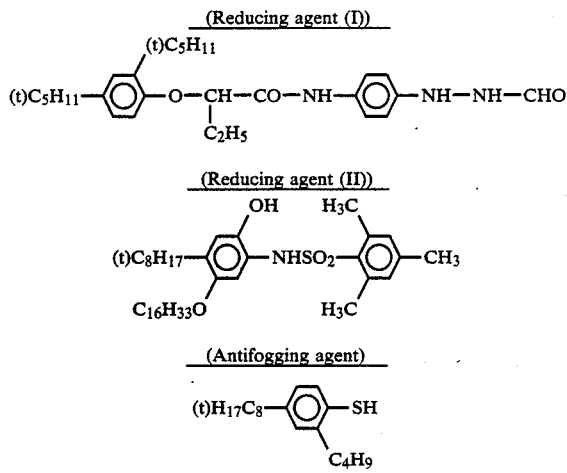

To the resulting solution was added 4.00 g of the silver halide emulsion, and the mixture was stirred at 15,000 r.p.m. for 3 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% solution of sulfuric acid, the light-sensitive composition was added to the resulting solution, and the mixture was stirred at 7,000 r.p.m. for 2 minutes using homogenizer to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 3.00 g of 8.00% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 5.0 g of methanol was added 1.6 g of the following compound (base), and adjusted to a pH of 6.3 using 15% aqueous solution of trichloro acetate. To 10.0 g of the light-sensitive microcapsule dispersion were added 1.0 g of 5% aqueous solution of Emulex NP-8 (tradeneme of Nippon Emulsion Co., Ltd.) and 2.82 g of the resulting mixture of the base to prepare a coating solution.

The coating solution was uniformly coated on a polyethylene terephthalate film (thickness: 100 μm) using a wire bar of #40 and dried at 40° C. for 30 minutes to obtain a light-sensitive material.

(Base)

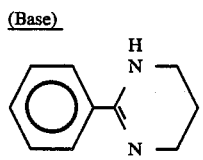

Evaluation of image-receiving material

Each of the image-receiving materials prepared in Examples 1 to 3 and Comparison Example 1 was evaluated by the following manner.

(1) The light-sensitive material was imagewise exposed to light using a tungsten lamp at 5,000 lux for 1 second through a filter in which the density is continuously changed from 0 to 2.0, and then heated on a hot plate at 125° C. for 10 seconds. The exposed and heated light-sensitive material was then combined with each of the image-receiving materials and passed through press rolls under pressure of 400 kg/cm$^2$ to obtain a magenta positive image on each of the image-receiving materials. The density of the obtained image was measured using Macbeth's reflection densitometer.

(2) Each of the image-receiving materials was then combined with a paper and passed through press rolls under pressure of 400 kg/cm$^2$ to obtain a further transferred magenta positive image on the paper. The density of the obtained image was measured using Macbeth's reflection densitometer.

The results are set forth in Table 2.

TABLE 2

| Image-receiving Material | Density of Image on Image-receiving Material Maximum Density | Density of Image on Paper Maximum Density |
|---|---|---|
| (A) | 1.12 | 0.12 |
| (B) | 1.18 | 0.09 |
| (C) | 1.15 | 0.07 |
| (D) | 1.21 | 0.32 |

It is apparent from the results in Table 2 that each of the image-receiving materials (A), (B) and (C) gives a fixed image by the hardening agent, and the obtained image is hardly transferred to the paper compared with the image-receiving material (D).

I claim:

1. An image-forming method which comprises: imagewise exposing to light a light-sensitive material comprising a support and a light-sensitive layer containing silver halide, a reducing agent and a polymerizable compound;

simultaneously or thereafter developing the light-sensitive material;

pressing the light-sensitive material on an image-receiving material comprising a support and an image-receiving layer to transfer the unpolymerized polymerizable compound to the image-receiving layer of the image-receiving material, wherein the image-receiving layer contains a hardening agent being capable of polymerizing the polymerizable compound without necessity of external energy.

2. The image-forming method as claimed in claim 1, wherein the hardening agent is a compound having two or more nucleophilic groups in the molecule.

3. The image-forming method as claimed in claim 1, wherein the hardening agent is a compound having a functional group selected from the group consisting of imino, amino and sulfino.

4. The image-forming method as claimed in claim 1, wherein the hardening agent is a compound selected from the group consisting of ethylenediamine, propylenediamine, 1,3-diamino-2-hydroxypropane, 1,3-trimethylenediamine, N,N'-dimethylethylenediamine, 1,4-diaminobutane, hexamethylenediamine, diethylenetriamine, triethylenetetraamine,

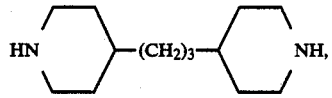

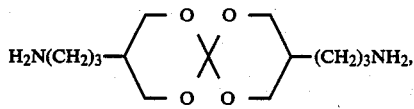

polyethyleneimine, polyallylamine, poly-L-lysine, poly-L-ornithine, $NaO_2S-CH_2CH=CHCH_2SO_2Na$ and sodium salt of polyvinylbenzenesulfinic acid.

5. The image-forming method as claimed in claim 1, wherein the hardening agent is a compound selected from the group consisting of polyethyleneimine, 1,3-diamino-2-hydroxypropane and sodium salt of polyvinylbenzenesulfinic acid.

6. The image-forming method as claimed in claim 1, wherein the hardening agent is contained in the image-receiving layer in an amount of from 0.0001 to 0.1 mole/m$^2$.

7. The image-forming method as claimed in claim 1, wherein the hardening agent is contained in the image-receiving layer in an amount of from 0.1 to 200 mole % based on the amount of the polymerizable compound contained in the light-sensitive layer.

8. The image-forming method as claimed in claim 1, wherein the polymerizable compound has an ethylenic unsaturated bond.

9. The image-forming method as claimed in claim 1, wherein the polymerizable compound has two or more ethylenic unsaturated bonds in the molecule.

10. The image-forming method as claimed in claim 1, wherein the polymerizable compound is an acrylic ester or an acrylic amide.

11. The image-forming method as claimed in claim 1, wherein the silver halide is contained in the light-sensitive layer in such amount that the total silver content is in the range of 0.1 mg/m$^2$ to 10 gm$^2$, the reducing agent is contained in the light-sensitive layer in an amount of from 0.1 to 1,500 mole % based on the amount of silver, and the polymerizable compound is contained in an amount of from 5 to $1.2 \times 10^5$ times by weight as much as amount of silver halide.

12. The image-forming method as claimed in claim 1, wherein the development is done by a heat development process.

13. The image-forming method as claimed in claim 1, wherein the development is done by a heat development process at a temperature of from 80 to 200° C.

* * * * *